(12) United States Patent
Kim

(10) Patent No.: US 9,496,874 B2
(45) Date of Patent: Nov. 15, 2016

(54) RECEIVER CIRCUIT AND SIGNAL RECEIVING METHOD THEREOF

(71) Applicant: SAMSUNG ELECTRONICS CO., LTD., Suwon-si (KR)

(72) Inventor: Eonguk Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/868,605

(22) Filed: Sep. 29, 2015

(65) Prior Publication Data

US 2016/0105183 A1    Apr. 14, 2016

(30) Foreign Application Priority Data

Oct. 10, 2014  (KR) .................. 10-2014-0136836

(51) Int. Cl.
| | |
|---|---|
| *H03L 5/00* | (2006.01) |
| *H03K 19/0185* | (2006.01) |
| *H03K 3/356* | (2006.01) |
| *H03K 19/003* | (2006.01) |
| *H03K 17/10* | (2006.01) |

(52) U.S. Cl.
CPC ...... *H03K 19/018521* (2013.01); *H03K 3/356* (2013.01); *H03K 19/00315* (2013.01); *H03K 17/102* (2013.01)

(58) Field of Classification Search
CPC .................... H03K 19/018521; H03K 3/356; H03K 19/00315; H03K 17/102; H03K 3/012
USPC .................. 327/306, 333; 326/61–62, 80–81
See application file for complete search history.

(56) References Cited

U.S. PATENT DOCUMENTS

| | | | |
|---|---|---|---|
| 5,465,054 A | 11/1995 | Erhart | |
| 5,489,862 A * | 2/1996 | Risinger | .......... H03K 19/00353 326/83 |
| 5,952,848 A | 9/1999 | Morris | |
| 6,069,515 A | 5/2000 | Singh | |
| 6,084,430 A | 7/2000 | Wayner | |
| 6,288,599 B1 | 9/2001 | Coddington | |
| 6,346,829 B1 | 2/2002 | Coddington | |
| 6,353,333 B1 | 3/2002 | Curd et al. | |
| 6,356,099 B1 * | 3/2002 | Lee | ....................... H03K 3/3565 326/24 |
| 6,392,440 B2 * | 5/2002 | Nebel | .............. H03K 19/00315 326/34 |
| 7,002,400 B2 | 2/2006 | Koo | |
| 7,190,191 B1 * | 3/2007 | Mathur | ............ H03K 19/00315 326/68 |
| 7,365,571 B2 | 4/2008 | Seo et al. | |

(Continued)

FOREIGN PATENT DOCUMENTS

KR          10-0324326 B1     2/2002

*Primary Examiner* — Dinh T Le
(74) *Attorney, Agent, or Firm* — Sughrue Mion, PLLC

(57) ABSTRACT

Provided is a receiver circuit which receives an input signal. A first restriction circuit provides a first reference voltage or an input signal higher than the first reference voltage to a first node. A second restriction circuit provides a second reference voltage or the input signal lower than the second reference voltage to a second node. A first PMOS transistor pulls up an output node based on a voltage of the first node, and a first NMOS transistor pulls down the output node based on a voltage of the second node. A second PMOS transistor is connected between the output node and the first PMOS transistor, and a second NMOS transistor is connected between the output node and the first NMOS transistor. At least one compensation resistor is connected between a power supply voltage and the first PMOS transistor or between the first NMOS transistor and a ground.

20 Claims, 12 Drawing Sheets

(56) References Cited

U.S. PATENT DOCUMENTS

| | | | |
|---|---|---|---|
| 7,495,483 B2 * | 2/2009 | Kumar | H03K 19/00384 326/62 |
| 7,521,970 B2 | 4/2009 | Gupta et al. | |
| 7,532,034 B2 | 5/2009 | Ker et al. | |
| 7,541,837 B2 * | 6/2009 | Lines | G11C 8/08 326/68 |
| 7,564,287 B2 | 7/2009 | Chen | |
| 7,696,807 B2 | 4/2010 | Takahashi | |
| 7,741,874 B2 | 6/2010 | Nedalgi | |
| 8,283,964 B2 | 10/2012 | Cassia | |
| 8,446,204 B2 | 5/2013 | Srivastava et al. | |
| 8,482,329 B2 | 7/2013 | Deshpande et al. | |
| 8,502,568 B2 | 8/2013 | Dwivedi et al. | |
| 8,633,737 B2 * | 1/2014 | Wang | H03K 19/00315 327/108 |
| 2004/0232946 A1 | 11/2004 | Koo | |
| 2006/0001448 A1 | 1/2006 | Seo et al. | |
| 2007/0210838 A1 | 9/2007 | Gupta et al. | |
| 2007/0273404 A1 | 11/2007 | Ker et al. | |
| 2008/0143428 A1 | 6/2008 | Takahashi | |
| 2009/0058517 A1 | 3/2009 | Chen | |
| 2009/0261860 A1 | 10/2009 | Nedalgi | |
| 2010/0033214 A1 | 2/2010 | Deshpande et al. | |
| 2011/0018606 A1 | 1/2011 | Cassia | |
| 2012/0044608 A1 | 2/2012 | Dwivedi et al. | |
| 2012/0194254 A1 | 8/2012 | Srivastava et al. | |

* cited by examiner

RECEIVER CIRCUIT AND SIGNAL RECEIVING METHOD THEREOF

CROSS-REFERENCE TO RELATED APPLICATION

This application claims priority from Korean Patent Application No. 10-2014-0136836, filed Oct. 10, 2014, in the Korean Intellectual Property Office, the disclosure of which is incorporated herein by reference in its entirety.

BACKGROUND

1. Field

Apparatuses and methods consistent with exemplary embodiments relate to a semiconductor device, and more particularly to, a receiver circuit to receive a signal and a signal receiving method thereof.

2. Description of the Related Art

In recent mobile technology trends, researches have been conducted to achieve a semiconductor integrated circuit having a higher integration, higher performance, and lower power consumption. Among various methods of reducing power consumption of the semiconductor integrated circuit, a method of lowering a driving voltage of the semiconductor integrated circuit is widely used. In this method, a voltage of less than about 1.0 V may be used as a power supply voltage of a logic circuit that is included in a system on chip (SoC). A signal magnitude that is set to be higher than about 1.0 V is signaled to satisfy various standards and interfaces in interchip communications. This means that a data and/or signal receiving circuit needs to provide a large margin with respect to various levels of input signals for the transmission and reception of various data between chips.

A complementary metal oxide semiconductor (CMOS) process for fabricating elements that are tolerant of a high-voltage signal is needed for a chip to receive various levels of signals. However, the CMOS process is expensive. Thus, there is a need for an input circuit which converts a voltage level of a high-voltage signal into a logical level and a voltage level of a low-voltage signal into the same logical level.

SUMMARY

According to an aspect of an exemplary embodiment, there is provided a receiver circuit which receives an input signal through a pad. The receiver circuit includes a first restriction circuit configured to provide a first reference voltage or an input signal to a first node, the input signal having a voltage higher than the first reference voltage; a second restriction circuit configured to provide a second reference voltage or the input signal to a second node, the input signal having a voltage lower than the second reference voltage; a first PMOS transistor configured to pull up an output node based on a voltage of the first node; a first NMOS transistor configured to pull down the output node based on a voltage of the second node; a second PMOS transistor connected between the output node and the first PMOS transistor; a second NMOS transistor connected between the output node and the first NMOS transistor; and at least one compensation resistor connected between a power supply voltage and one end of the first PMOS transistor or between one end of the first NMOS transistor and a ground.

According to an aspect of another exemplary embodiment, there is provided a receiver circuit. The receiver circuit includes a first restriction circuit configured to provide an input signal higher than a first reference voltage to a first node; a second restriction circuit configured to provide the input signal lower than a second reference voltage to a second node; a first PMOS transistor configured to pull up an output node based on a voltage of the first node; a first NMOS transistor configured to pull down the output node based on a voltage of the second node; a second PMOS transistor having a gate connected to the first node, and being connected between a power supply voltage and a source of the first PMOS transistor; a first hysteresis setting part configured to control a voltage of the source of the first PMOS transistor based on the output signal; a second NMOS transistor having a gate connected to the second node, and being connected between a source of the first NMOS transistor and a ground; and a second hysteresis setting part configured to control a voltage of the source of the first NMOS transistor based on the output signal.

According to an aspect of still another exemplary embodiment, there is provided a signal receiving method of a receiver circuit which is formed using a low-voltage process and receives an input signal having a higher voltage. The signal receiving method includes providing, in response to the input signal, a first input signal having a level higher than a first reference voltage and a second input signal having a level lower than a second reference voltage; driving a first PMOS transistor for pulling up an output node to the high voltage in response to the first input signal; and driving a first NMOS transistor for pulling down the output node to a ground voltage in response to the second input signal, wherein a second PMOS transistor controlled by the first reference voltage is connected between the output node and the first PMOS transistor and a second NMOS transistor controlled by the second reference voltage is connected between the output node and the first NMOS transistor.

According to an aspect of still another exemplary embodiment, there is provided a receiver circuit. The receiver circuit includes a first restriction circuit configured to output, to a first node, a first reference voltage or higher based on an input signal and the first reference voltage; a second restriction circuit configured to output, to a second node, a second reference voltage or lower based on the input signal and the second reference voltage; a pull-up part configured to pull up the output node based on a voltage of the first node; and a pull-down part configured to pull down the output node based on a voltage of the second node, wherein at least one of the first and second reference voltages is adjusted according to a level of a power supply voltage.

According to an aspect of still another exemplary embodiment, there is provided a receiver circuit. The receiver circuit includes a first PMOS transistor configured to pull up an output node to a higher voltage in response to a first reference voltage or higher that is obtained by controlling a level of an input signal; a first NMOS transistor configured to pull down the output node to a ground voltage in response to a second reference voltage or lower that is obtained by controlling the level of the input signal, a second PMOS transistor connected between the output node and the first PMOS transistor; and a second NMOS transistor connected between the output node and the first NMOS transistor.

BRIEF DESCRIPTION OF THE FIGURES

The above and/or other aspects will be more apparent by describing certain exemplary embodiments with reference to the accompanying drawings, in which.

DETAILED DESCRIPTION

Figure 1:
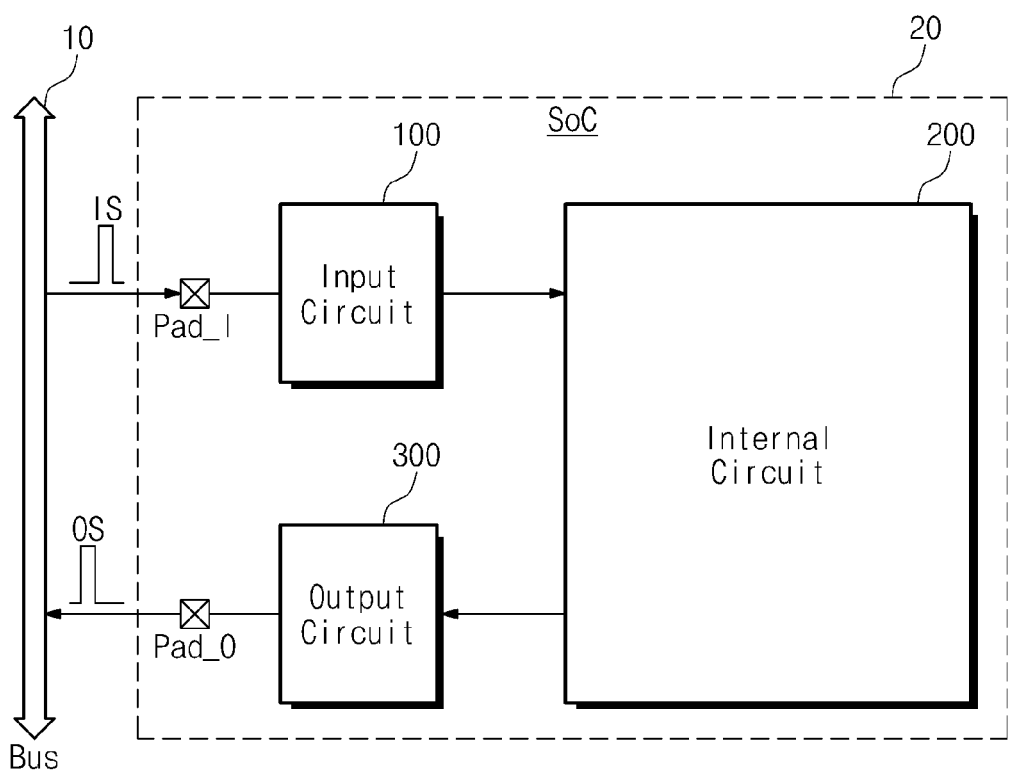
FIG. 1 is a block diagram schematically illustrating an input/output structure of a system on chip according to an exemplary embodiment.

Exemplary embodiments will be described in detail with reference to the accompanying drawings. The inventive concept, however, may be embodied in various different forms, and should not be construed as being limited only to the illustrated embodiments. Rather, these exemplary embodiments are provided as examples so that this disclosure will be thorough and complete, and will fully convey the concept of the inventive concept to those skilled in the art. Accordingly, known processes, elements, and techniques are not described with respect to some of the exemplary embodiments. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (e.g., rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all of combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. On the other hand, when an element is referred to as being "directly on," "directly connected to", "directly coupled to", or "immediately adjacent to" another element or layer, there are no intervening elements or layers present.

Unless otherwise defined, all of the terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Below, a system on chip may be used as a unit example to describe the features and functions of the inventive concept. Any other features and functions of the inventive concept may be well understood by one skilled in the art. The term "high voltage" may be used to indicate a relatively high voltage among various levels of power supply voltages for driving the system on chip, and the term "low voltage" may be used to indicate a voltage provided as a driving voltage of a general logic circuit that is included in the system on chip. However, the high voltage and the low voltage may be variable with the advancement of low-power technology.

FIG. 1 is a block diagram schematically illustrating an input/output structure of a system on chip according to an exemplary embodiment. Referring to FIG. 1, a system on chip 20 exchanges signals with a bus 10 and includes an input/output circuit 100, an internal circuit 200, and an output circuit 300.

The bus 10 may include conductive lines and control circuits. The conductive lines are used to exchange data and/or control signals between chips of a device (e.g., mobile device) equipped with the system on chip 20. Data that is exchanged between the bus 10 and the system on chip 20 may include control signals and/or data signals.

An input signal IS from the bus 10 is transmitted to the system on chip 20 through an input pad Pad_I. The input circuit 100 provides the input signal IS, input through the input pad Pad_I, to the internal circuit 200. The input circuit 100 may use various power supply voltages as an operating voltage. For example, the input circuit 100 may use a high voltage VDDH (e.g., 3.3 V) or a low voltage VDD (e.g., 1.8 V). The input circuit 100 may include transistors that are formed using a low-voltage process and may receive the input signal IS using the high voltage VDDH as an operating voltage. When a voltage level of the input signal IS corresponds to a level of the low voltage VDD or signaling of the bus 10 is based on the low voltage, the input circuit 100 uses the low voltage VDD as a power supply voltage.

The internal circuit 200 is a circuit that generates data using an internal operation of the system on chip 20 or processes data provided from an external device. The internal circuit 200 may perform various operations in response to the input signal IS from the input circuit 100. The internal circuit 200 transmits resultant data of the various operations of the internal circuit 200 to the output circuit 300, which outputs the resultant data to the external device.

The output circuit 300 converts data from the internal circuit 200 into an output signal OS. A voltage level of a data signal output from the internal circuit 200 is relatively low. When a voltage level of a signal based on signaling of the bus 10 is different from that of a signal from the internal circuit 200, the output circuit 300 compensates for the difference. In other words, when the signaling of the bus 10 is based on a high-voltage (VDDH) level, the output circuit 300 converts a signal level of the output data into a high-voltage level.

According to an exemplary embodiment, a configuration of the system on chip 20 includes the input circuit 100. While the input circuit 100 is formed using the low-voltage process, the input circuit 100 receives the input signal IS using the high voltage as an operating voltage. A voltage level of the input signal may be converted into a voltage level that is capable of being processed by the input circuit 200.

In the recent system on chip, a power supply voltage of a logic circuit continues to decrease (e.g., substantially 1.0 V or lower). However, the system on chip 20 needs to support input/output signals that have various voltage levels ranging from a lower voltage level of, for example, 1.2 V to a high voltage level of, for example, 3.3 V for interfacing with external chips. Thus, it is desired to provide elements corresponding to input/output standards or voltage standards through a complementary metal oxide semiconductor (CMOS) process. To this end, high-voltage transistors for high-voltage input/output signals and low-voltage transistors for low-voltage input/output signals may be provided, which significantly increases process steps and manufacturing costs.

According to an exemplary embodiment, the input circuit 100 receives low-voltage and high-voltage signals (e.g., 1.8 V and 3.3 V signals) using low-voltage transistors. The input circuit 100 satisfies various input standards using a high voltage as an operating voltage of a receiver for receiving a signal through the input pad Pad_I, thereby providing a wider noise margin.

Figure 2:
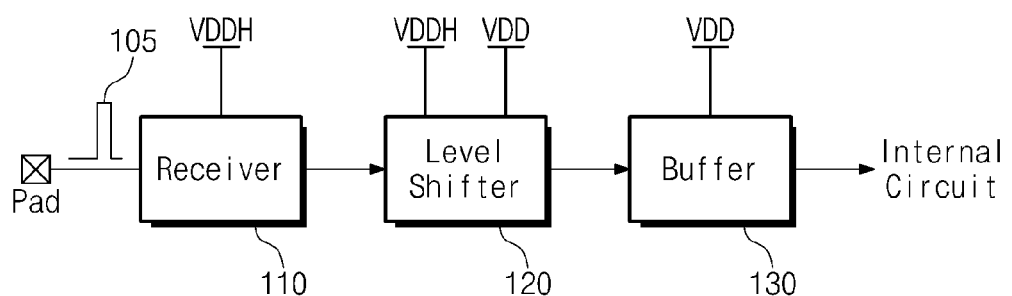
FIG. 2 is a block diagram schematically illustrating an input circuit according to an exemplary embodiment.

FIG. 2 is a block diagram schematically illustrating an input circuit 100a according to an exemplary embodiment. Referring to FIG. 2, an input circuit 100a according to an exemplary embodiment includes a receiver 110, a level shifter 120, and a buffer 130.

The receiver 110 receives an input signal 105 through a pad as an electric signal, which will be processed by a chip. The receiver 110 receives the input signal 105 using a high voltage VDDH as a power supply voltage. The receiver 110 may be implemented using a CMOS circuit or a Schmitt trigger circuit which drives the input signal 105, provided from the outside of the system on chip 20 through a pad, using the high voltage VDDH. The receiver 110 may be implemented using a low-voltage process, but may receive the high voltage VDDH as a power supply voltage.

The receiver 110 processes the high-voltage input signal (e.g., 3.3-V input signal) without lowering a voltage thereof. Compared to a receiver (e.g., a tolerant input circuit) using a low power supply voltage, the receiver 110 determines a logical value without adjusting a voltage level of the input signal 105. Thus, the receiver 110 provides high integrity of data about the input signal 105 that is based on a high-voltage standard.

The level shifter 120 converts a voltage level of an output signal of the receiver 110 into a voltage level that is capable of being processed by the internal circuit 200 or the buffer 130. The level shifter 120 converts an output signal, which swings between the high voltage VDDH and a ground voltage, into a signal which swings between the low voltage VDD and the ground voltage. To process an output signal of the receiver 110 that uses the high voltage VDDH as a power supply voltage, the level shifter 120 is supplied with both the high voltage VDDH and the low voltage VDD. That is, the level shifter 120 converts a signal in a high-voltage (VDDH) domain into a signal in a low-voltage (VDD) domain and provides the converted signal to the buffer 130.

The buffer 130 temporarily stores the input signal 105 of which the voltage level is converted by the level shifter 120. The input signal 105 stored at the buffer 130 is provided to the internal circuit 200. The buffer 130 may be driven by the same voltage level as that of a signal to be processed by the internal circuit 200. That is, the buffer 130 is supplied with the low voltage VDD and receives and outputs an output signal of the level shifter 120.

The input circuit 100a contains the receiver 110 that uses the high voltage VDDH as a power supply voltage. Thus, in a case where a system on chip according to an exemplary embodiment is included in a system using high-voltage signaling, an input signal may be received without loss of integrity. In addition, while the receiver 110 is driven by the high voltage VDDH, elements of the receiver 110 may be fabricated using a low-voltage process, thereby reducing manufacturing costs.

Figure 3:
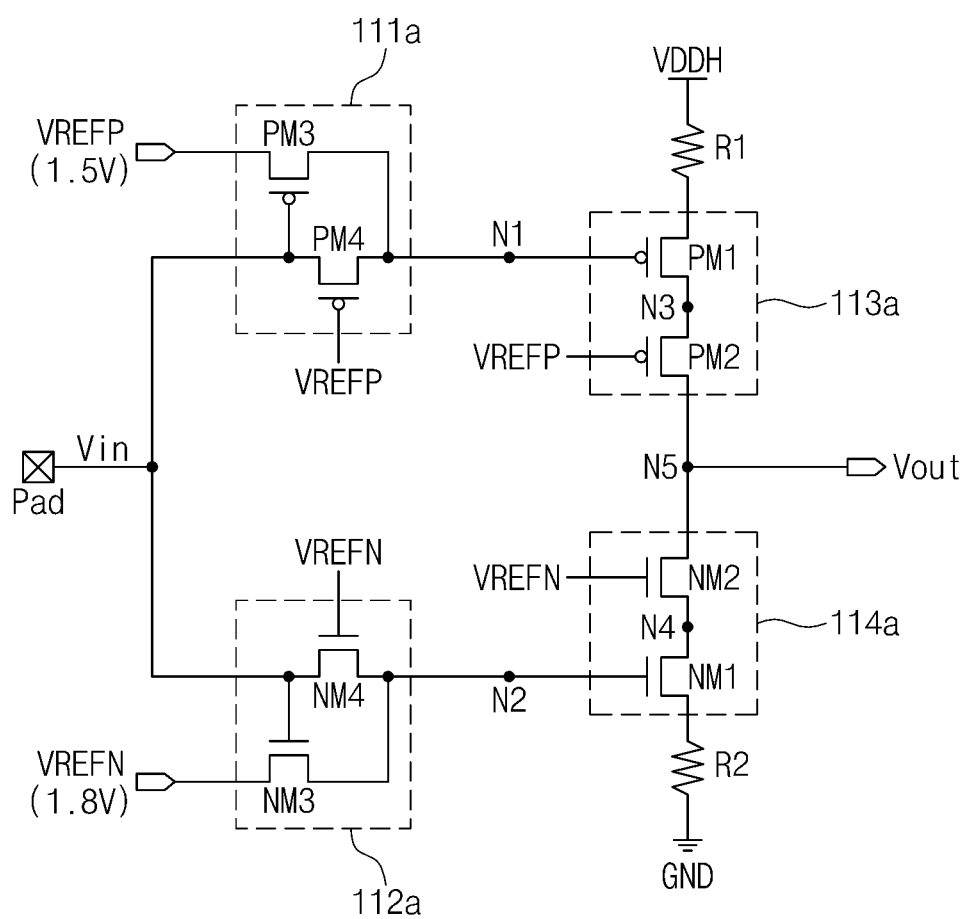
FIG. 3 is a circuit diagram showing a receiver shown in FIG. 2.

FIG. 3 is a circuit diagram showing a receiver shown in FIG. 2. Referring to FIG. 3, a receiver 110a contains restriction circuits 111a and 112a, transistors PM1 and NM1 constituting an inverter, protection transistors PM2 and NM2, and compensation resistors R1 and R2.

The restriction circuits 111a and 112a include transistors that respectively provide gate voltages of the transistors PM1 and NM1 constituting an inverter in response to an input signal Vin. When a voltage level of the input signal Vin is higher than a level of a first reference voltage VREFP, the first restriction circuit 111a transfers the input signal Vin to a first node N1, which is connected to a gate of the transistor PM1. That is, a voltage of the first node N1 is restricted to be greater than or equal to the first reference voltage VREFP, under a control of the first restriction circuit 111a. When the voltage level of the input signal Vin is lower than the level of the first reference voltage VREFP, the first restriction circuit 111a sets a voltage of the first node N1 to the first reference voltage VREFP regardless of the voltage level of the input signal Vin.

The second restriction circuit 112a transmits the input signal Vin to a second node N2, which is connected to a gate of the transistor NM1, in response to the voltage level of the input signal Vin being lower than a level of a second reference voltage VREFN. That is, a voltage of the second node N2 is restricted to be lower than the second reference voltage VREFN under a control of the second restriction circuit 112a. When a voltage level of the input signal Vin is higher than the level of the second reference voltage VREFN, the second restriction circuit 112a controls the second node N2 to maintain the second reference voltage VREFN regardless of the voltage level of the input signal Vin. Operations of the restriction circuits 111a and 112a in response to a voltage variation of the input signal Vin will be described in detail later with reference to FIG. 4.

The transistors PM1 and NM1 constituting the inverter are PMOS and NMOS transistors, respectively. The PMOS transistor PM1 transfers a power supply voltage VDDH in response to a gate voltage of the first node N1. The PMOS transistor PM1 is turned off when a voltage of the first node N1 set by the first restriction circuit 111a reaches a voltage that is lower than a voltage of a third node N3 by a threshold voltage Vtp. The NMOS transistor NM1 pulls down a voltage of an output terminal N5 in response to a gate voltage of the second node N2. The NMOS transistor NM1 is turned on when a voltage of the second node N2 controlled by the second restriction circuit 112a is higher than a threshold voltage Vtn. It may be understood that a turn-off condition of the NMOS transistor NM1 is opposite to a turn-on condition thereof.

The protection transistors PM2 and NM2 may protect the transistors PM1 and NM1 that invert a power supply voltage being the high voltage VDDH. The first reference voltage VREFP is provided to a gate of the first protection transistor PM2. The first reference voltage VREFP may have a level that is sufficient to turn on PMOS transistors. The first protection transistor PM2 divides a voltage between the output terminal N5 and the high voltage VDDH to lower a voltage across the PMOS transistor PM1. The PMOS transistor PM1 is protected by preventing the high voltage VDDH provided as a power supply voltage from being applied to the PMOS transistor PM1. The second protection transistor NM2 divides a voltage between the output terminal N5 and the ground GND to lower a level of a voltage across the first NMOS transistor NM1. In a case where a level of a voltage set at the output terminal N5 is the high voltage VDDH, the second protection transistor NM2 prevents the high voltage VDDH from being applied to the first NMOS transistor NM1. Thus, the first NMOS transistor NM1 is protected against the high voltage VDDH.

The compensation resistors R1 and R2 may reduce a characteristic variation of the receiver 110a according the process, voltage, and temperature. The compensation resistors R1 and R2 divide the high voltage VDDH to be applied to a pull-up part 113a and a pull-down part 114a of the inverter. The compensation resistors R1 and R2 may be implemented using resistors having the same resistance value. Alternatively, the compensation resistors R1 and R2 may be implemented using resistors having different resistance values. There may be a case where a voltage of the first node N1 is maintained to the first reference voltage VREFP and a voltage of the second node N2 varies during a rising interval of the input signal Vin. In this case, current flowing through the pull-up and pull-down parts 113a and 114a may be out of a desired range according to the process, voltage, or temperature. This means that a logic threshold of the receiver 110a varies with an environment. The magnitude of current that flows through the pull-up and pull-down parts 113a and 114a may be reduced by the compensation resistors R1 and R2, and a variation in the current may also be reduced. Thus, it is possible to reduce a variation in the logic threshold of the receiver 110a through the compensation resistors R1 and R2.

In the above, a receiver 110a that includes a CMOS inverter is described. By using elements which are formed through a low-voltage process, the receiver 110a according to an exemplary embodiment may operate under a high-voltage (VDDH) condition using the protection transistors PM2, NM2, the restriction circuits 111a and 112a, and the compensation resistors R1 and R2. Thus, an input circuit according to an exemplary embodiment may be easily applied to or mounted on a system that is based on a high-voltage interface standard.

Figure 4:
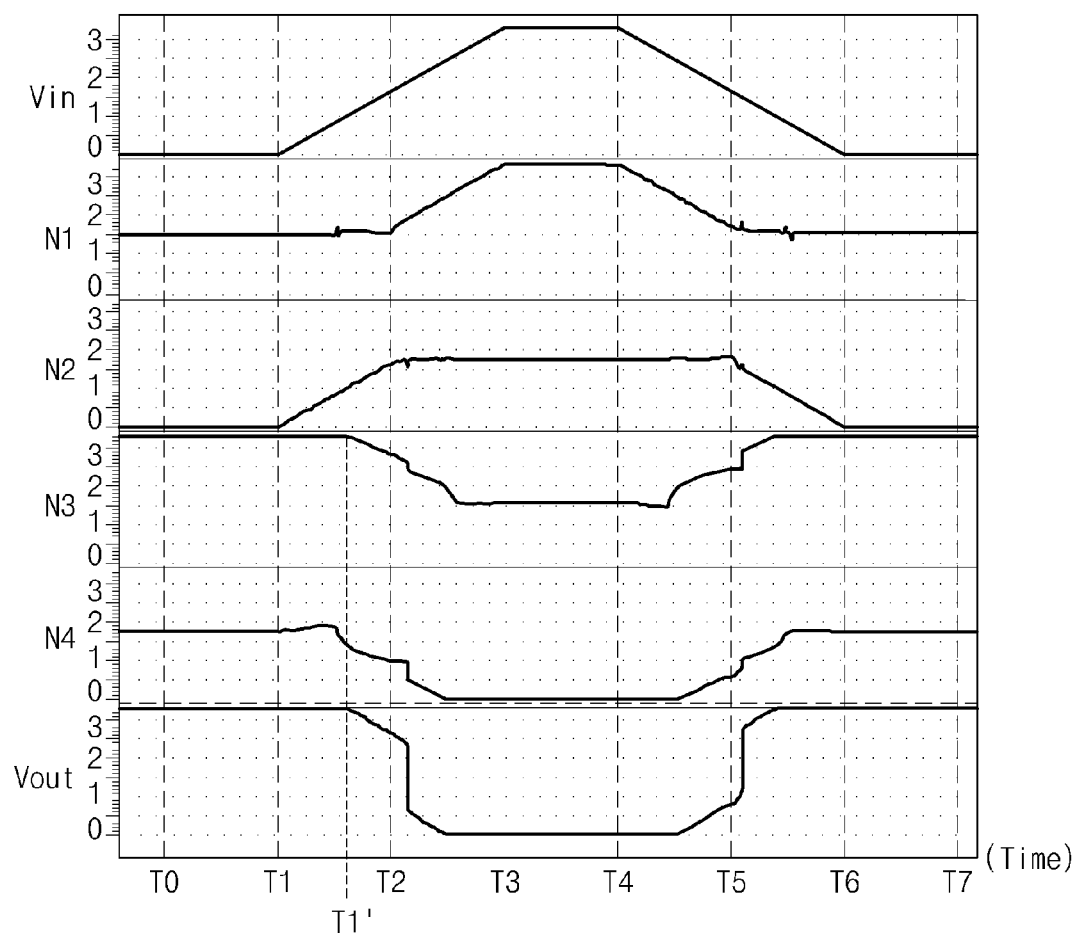
FIG. 4 is a waveform showing an operation of a receiver shown in FIG. 3.

FIG. 4 is a waveform showing an operation of the receiver 110a shown in FIG. 3. Referring to FIG. 4, the receiver 110a provides an output signal Vout having high reliability with respect to an input signal Vin having a high-voltage swing level. It is assumed that the high voltage VDDH provided as a power supply voltage is 3.3 V, the first reference voltage VREFP is 1.5 V, and the second reference voltage VREFN is 1.8 V. The first reference voltage VREFP may have a level corresponding to a difference between a power supply voltage and the second reference voltage VREFN.

Before a point in time T1, the input signal Vin has 0 V. Thus, the first restriction circuit 111a sets the first node N1 to 1.5 V. That is, the PMOS transistor PM3 of the first restriction circuit 111a is turned on by the input signal Vin of 0 V. Also, the PMOS transistor PM4 is turned off by the input signal Vin of 0 V and the first reference voltage VREFP, which is a gate voltage of the PMOS transistor PM4, being higher than a source voltage corresponding to the input signal Vin. Thus, a voltage of the first node N1 is set to the first reference voltage VREFP, which is a voltage of a source of the turned-on PMOS transistor PM3. At this state, the PMOS transistor PM1, which receives a voltage of the first node N1 as a gate voltage and the high voltage VDDH as a source voltage, is turned on and the protection transistor PM2, which receives the first reference voltage VREFP as a gate voltage and a voltage of the third node N3 as a source voltage, is turned on.

Before the point in time T1, the voltage of the second node N2 is set to 0 V by the second restriction circuit 112a. That is, an NMOS transistor NM3 of the second restriction circuit 112a is turned off by the input signal Vin having a voltage of 0 V. Also, the NMOS transistor NM4 of the second restriction circuit 112a is turned on because a gate voltage of the NMOS transistor NM4, which is the second reference voltage VREFN, is higher than a voltage of a source to which the input signal Vin is provided. At this point in time, thus, a voltage of the second node N2 is set to 0 V corresponding to the input signal Vin. The NMOS transistor NM1 is turned off which receives a voltage of the second node N2 as a gate voltage and a ground voltage as a source voltage. A fourth node N4 is set to the second reference voltage VREFN that is a gate voltage of the second protection transistor NM2.

Accordingly, the output terminal N5 is pulled up to the high voltage VDDH (i.e., 3.3 V) and is isolated from a ground. Thus, an output signal Vout having a high-voltage level (i.e., 3.3 V) is output.

A voltage level of the input signal Vin that is provided through a pad increases from the point in time T1 to a point in time T2. At this time, the first restriction circuit 111a controls the first node N1 to maintain the first reference voltage VREFP i.e., 1.5 V. The PMOS transistor PM4 maintains a turn-off state because a source voltage, which is a voltage of the input signal Vin, is lower than a gate voltage VREFP. Since a voltage level of the input signal Vin that is provided as a gate voltage of the PMOS transistor PM3 is lower than the reference voltage VREFP, which is a source voltage of the PMOS transistor PM3, the PMOS transistor PM3 remains a turn-on state. Thus, the first node N1 maintains the first reference voltage VREFP that is 1.5 V. In addition, the input signal Vin received through the pad is transferred to the second node N2 by the second restriction circuit 112a. Since a voltage level of the input signal Vin is lower than a level of the second reference voltage VREFN, the NMOS transistor NM3 maintains a turn-off state and the NMOS transistor NM4 maintains a turn-on state. Thus, the input signal Vin is transmitted to the second node N2.

Voltages of the third and fourth nodes N3 and N4 and the output signal Vout start to vary approximately from a point in time T1'. That is, the NMOS transistor NM1 is slowly turned on from the point in time T1' when a voltage level of the input signal Vin becomes higher than a threshold voltage Vtn of the first NMOS transistor NM1. A source voltage of the protection transistor NM2, which is previously turned off by a voltage of the fourth node N4, further drops, and a voltage level of the output signal Vout starts to drop according to a decrease in a voltage of the fourth node N4.

At the point in time T2, a voltage level of the input signal Vin reaches a voltage level (e.g., VREFP+Vtp) that is higher than levels of gate-source voltages of the PMOS transistors PM3 and PM4 of the first restriction circuit 111a. Accordingly, the PMOS transistor PM3 is turned off, and the PMOS transistor PM4 is turned on. Thus, the input signal Vin is transferred to the first node N1 from the point in time T2. That is, during an interval where a voltage level of the input signal Vin is higher than a voltage level (VREFP+Vtp) corresponding to a sum of the first reference voltage VREFP and a threshold voltage Vtp, a voltage of the first node N1 is set to be the same as that of the input signal Vin.

On the other hand, when a voltage level of the input signal Vin reaches a level of the second reference voltage VREFN at the point in time T2, the NMOS transistors NM3 and NM4 of the second restriction circuit 112a are operated to transfer the second reference voltage VREFN to the second node N2. That is, when a voltage level of the input signal Vin reaches a level of the second reference voltage VREFN, the NMOS transistors NM3 is turned on, and the NMOS transistor NM4 is turned off. Thus, during an interval where a voltage level of the input signal Vin is higher than a level of the second reference voltage VREFN, a voltage of the second node N2 is set to the second reference voltage VREFN.

Voltages of the third and fourth nodes N3 and N4 and the output signal Vout that start to drop from the point in time T1' continue to decrease after the point in time T2. Because the PMOS transistor PM1 transitions to a turn-off state according to a voltage of the first node N1, a voltage of the third node N3 drops to a voltage corresponding to a sum of the first reference voltage VREFP and the threshold voltage Vtp. A voltage of the fourth node N4 also drops to a ground level (i.e., 0 V). Also, a voltage of the output signal Vout drops to the ground level according to a voltage of the fourth node N4, as illustrated in FIG. 4.

At a point in time T3, the input signal Vin reaches a high-voltage level VDDH (e.g., 3.3 V). As described above, the restriction circuits 111a and 112a, the pull-up part 113a, and the pull-down part 114a according to an exemplary embodiment operate such that the output signal Vout having a ground level (e.g., 0 V) is output from a point in time when a voltage level of the input signal Vin becomes higher than the first reference voltage VREFP. The input circuit 100 according to an exemplary embodiment provides high integrity of data, based on the above operation of the receiver 110a.

As shown in FIG. 4, a voltage level of the input signal Vin starts to drop from a point in time T4. Voltage of respective nodes according to operations of the restriction circuits 111a and 112a, the pull-up part 113a, and the pull-down part 114a may be varied in response to a decrease in the input signal Vin in a manner opposite to the case where the input signal Vin increases. Thus, the receiver 110a operates from the point in time T4 to a point in time T7 in an opposite manner of operations described with reference to points in time T1 through T4, and a detailed description is omitted.

As above, an operation of the receiver 110a that is formed using a low-voltage process is described. While the receiver 110a is formed of low-voltage transistors, the protection transistors PM2 and NM2 and the compensation resistors R1 and R2 according to an exemplary embodiment may provide the receiver 110a having high reliability with respect to a high voltage.

Figure 5:
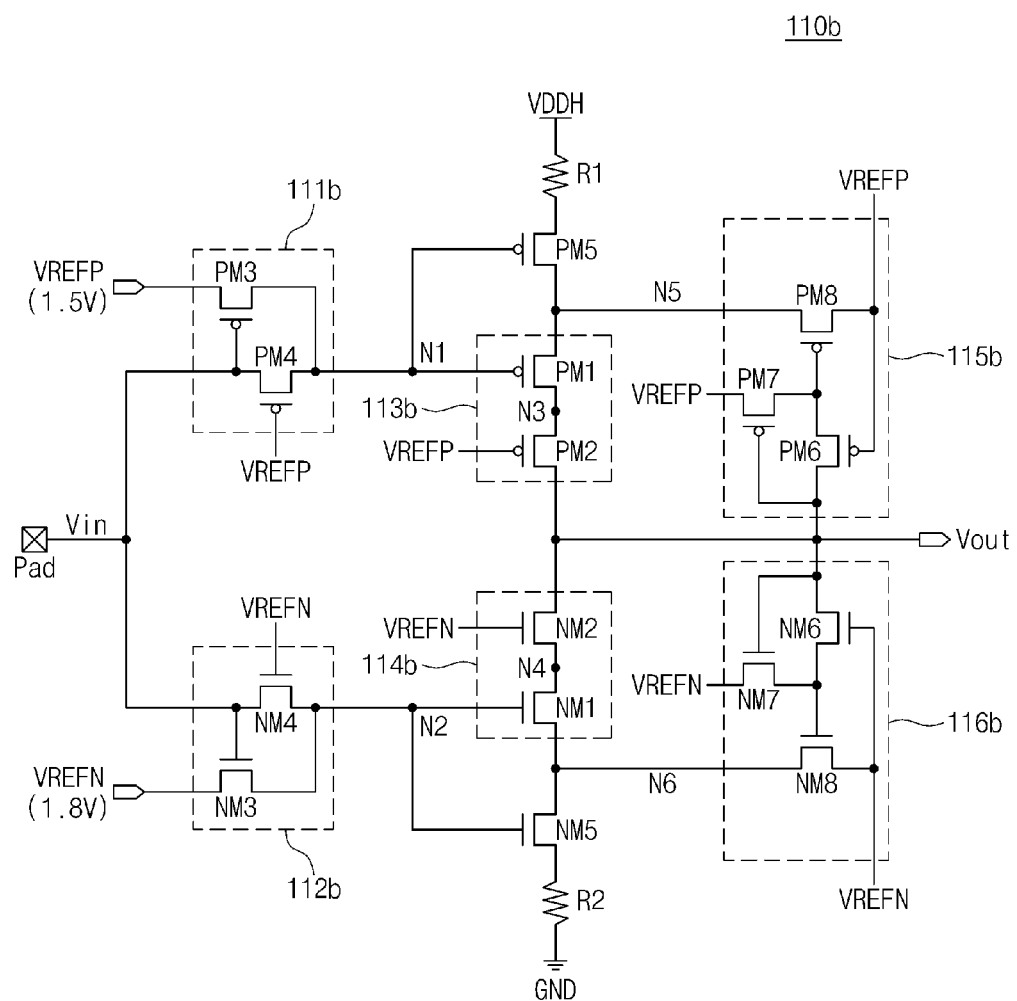
FIG. 5 is a circuit diagram showing a receiver according to another exemplary embodiment.

FIG. 5 is a circuit diagram showing a receiver 110 according to another exemplary embodiment. Referring to FIG. 5, a receiver 110b is of a Schmitt trigger type that uses a high voltage VDDH as a power supply voltage. The receiver 110b provides an output signal Vout having a hysteresis characteristic with respect to an input signal Vin and includes restriction circuits 111b and 112b, a pull-up part 113b, a pull-down part 114b, hysteresis setting parts 115b and 116b, and compensation resistors R1 and R2.

The restriction circuits 111b and 112b provide gate voltages of transistors PM1 and NM1 constituting an inverter in response to an input signal Vin. When a voltage level of the input signal Vin is higher than a level of a first reference voltage VREFP, the first restriction circuit 111b transfers the input signal Vin to a first node N1, which is connected to a gate of the transistor PM1. That is, a voltage of the first node N1 is restricted to be greater than the first reference voltage VREFP, under a control of the first restriction circuit 111b. When the voltage level of the input signal Vin is lower than a level of the first reference voltage VREFP, the first restriction circuit 111b sets the first node N1 to the first reference voltage VREFP regardless of the voltage level of the input signal Vin.

The second restriction circuit 112b transmits the input signal Vin to a second node N2, which is connected to a gate of the transistor NM1, in response to a voltage level of the input signal Vin being lower than a level of a second reference voltage VREFN. That is, a voltage of the second node N2 is restricted to be lower than the second reference voltage VREFN under a control of the second restriction circuit 112b. When a voltage level of the input signal Vin is higher than a level of the second reference voltage VREFN, the second restriction circuit 112a sets the second node N2 to maintain the second reference voltage VREFN regardless of the voltage level of the input signal Vin. Operations of the restriction circuits 111b and 112b in response to a level variation of the input signal Vin will be described in detail later.

The transistors PM1 and NM1 constituting the inverter are PMOS and NMOS transistors, respectively. The PMOS transistor PM1 transfers a power supply voltage VDDH in response to a gate voltage set at the first node N1. The PMOS transistor PM1 is turned off when a voltage of the first node N1 set by the first restriction circuit 111a is higher than a threshold voltage Vtp. The NMOS transistor NM1 pulls down a voltage of an output terminal N5 in response to a gate voltage set at the second node N2. The NMOS transistor NM1 is turned on when a voltage of the second node N2 set by the second restriction circuit 112a is higher than a threshold voltage Vtn. It may be understood that a turn-off condition of the NMOS transistor NM1 is opposite to a turn-on condition thereof.

The protection transistors PM2 and NM2 may protect the transistors PM1 and NM1 that invert a power supply voltage, which is the high voltage VDDH. The first reference voltage VREFP is provided to a gate of the first protection transistor PM2. The first reference voltage VREFP may have a level that is sufficient to turn on PMOS transistors. The first protection transistor PM2 divides a voltage between the output terminal N5 and the high voltage VDDH to lower a voltage across the PMOS transistor PM1. The PMOS transistor PM1 is protected by preventing the high voltage VDDH, which is provided as a power supply voltage, from being applied to the PMOS transistor PM1. The second protection transistor NM2 divides a voltage between the output terminal N5 and the ground GND to lower a voltage across the first NMOS transistor NM1. When a level of a voltage set at the output terminal N5 is the high voltage VDDH, the second protection transistor NM2 prevents the high voltage VDDH from being applied to the first NMOS transistor NM1. Thus, the first NMOS transistor NM1 is protected against the high voltage VDDH.

The hysteresis setting parts 115b and 116b are implemented using a circuit that provides a hysteresis effect of an output signal Vout to the input signal Vin. That is, the hysteresis setting parts 115b and 116b may constitute a component for setting different reference levels of the input signal Vin for a transition of the output signal Vout at rising and falling intervals of the input signal Vin. For example, the hysteresis setting parts 115b and 116b may control the output signal Vout to transition when a voltage level of the input signal Vin is greater than a level of a first threshold voltage VIH at a rising interval of the input signal Vin. The hysteresis setting parts 115b and 116b may control the output signal Vout to transition when a voltage level of the input signal Vin is smaller than a level of a second threshold voltage VIL in a falling interval of the input signal Vin.

Turn-on and turn-off levels of PMOS transistors PM5 and NM5 are determined depending on voltages of fifth and sixth nodes N5 and N6. That is, the PMOS transistor PM5 is turned off when a voltage of the first node N1 is lower than a voltage of the node N5 by a threshold voltage Vtp. On the other hand, the NMOS transistor NM5 is turned on when a voltage of the second node N2 is higher than a voltage of the sixth node N6 by a threshold voltage Vtn. With this characteristic, it is possible to provide the output signal Vout having a hysteresis characteristic with respect to the input signal Vin, which determines voltages of the first and second nodes N1 and N2.

In a rising interval of the input signal Vin, a transition of the output voltage Vout is controlled by the hysteresis setting part 116b that is supplied with the second reference voltage VREFN. When a voltage level of the input signal Vin is 0 V, the sixth node N6 is set to the second reference voltage VREFN. At this time, a voltage level of the output signal Vout is a level of a high voltage VDDH that is higher than a gate voltage VREFN of the NMOS transistor NM6. Thus, the NMOS transistor NM6 is turned off. On the other hand, NMOS transistors NM7 and NM8 are turned on. Consequently, a voltage of the sixth node N6 is set to the second reference voltage VREFN. When a voltage level of the input signal Vin increases, the NMOS transistor NM5 starts to be turned on and thereby a voltage of the sixth node N6 starts to decrease. However, the NMOS transistor NM1 is turned on when a voltage of the second node N2 becomes higher than a voltage of the sixth node N6 by a threshold voltage Vtn. From this point in time, a voltage level of the output signal Vout starts to decrease.

At a falling interval of the input signal Vin, a transition of an output voltage is controlled by the hysteresis setting part 115b that is supplied with the first reference voltage VREFP. Since the PMOS transistors PM5 and PM1 are turned off when the input signal Vin has a high voltage VDDH (e.g., 3.3 V), the fifth node N5 is set to the first reference voltage VREFP. At this time, the output signal Vout has 0 V corresponding to a ground level. Thus, the PMOS transistor PM6 is turned off, and PMOS transistors PM7 and PM8 are turned on. Consequently, a voltage of the fifth node N5 is set to the first reference voltage VREFP. However, when a voltage level of the input signal Vin decreases to be lower than (VDDH−Vtp), the PMOS transistor PM5 starts to be turned on and thereby voltage levels of the fifth node N5 and the output signal Vout start to increase.

An operation of the hysteresis setting part 116b in a falling interval of the input signal Vin is opposite to that in a rising interval of the input signal Vin. This will be described in detail with reference to a timing diagram later.

A circuit structure of the receiver 110b having a Schmitt trigger type is described above. Elements that constitute the restriction circuits 111b and 112b, the pull-up part 113b, the pull-down part 114b, the hysteresis setting parts 115b and 116b, and the compensation resistors R1 and R2 may be fabricated using a conventional low-voltage process. However, the receiver 110b according to an exemplary embodiment may be driven by a high voltage VDDH through elements that are fabricated using a low-voltage process. In addition, the receiver 110b may have a higher noise filtering characteristic because a Schmitt trigger circuit having high reliability is employed.

Figure 6:
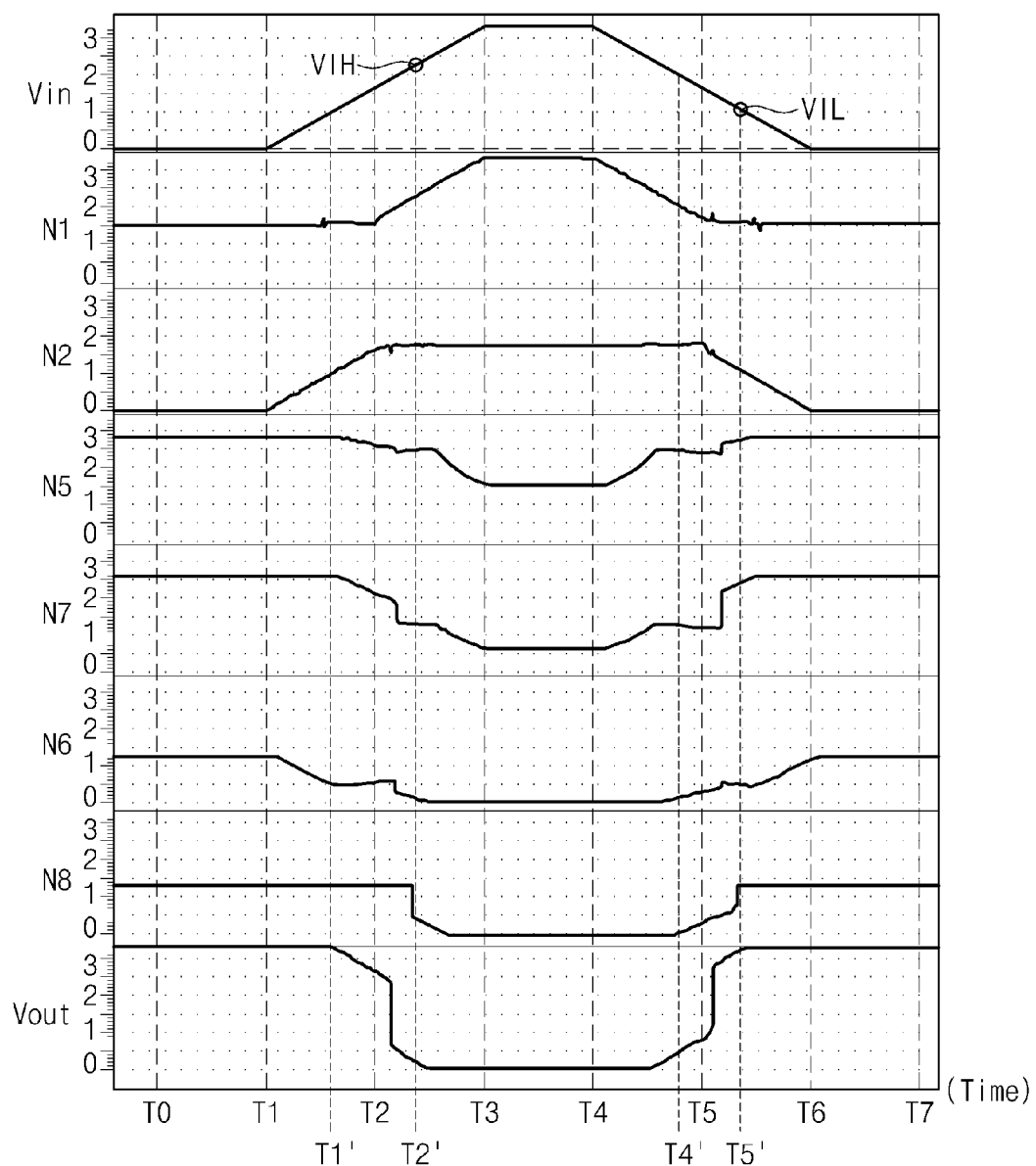
FIG. 6 is a waveform showing an operation of a receiver shown in FIG.

FIG. 6 is a waveform showing an operation of the receiver 110b shown in FIG. 5. Referring to FIG. 6, the receiver 110b provides an output signal Vout having high reliability with respect to an input signal Vin having a high-voltage swing level. It is assumed that the high voltage VDDH provided as a power supply voltage is 3.3 V, the first reference voltage VREFP is 1.5 V, and the second reference voltage VREFN is 1.8 V.

It is assumed that an input signal Vin maintains at 0 V before a point in time T1. Thus, the first restriction circuit 111a sets a voltage of the first node N1 to 1.5 V that is the same as the first reference voltage VREFP. That is, the PMOS transistor PM3 that is supplied with the input signal Vin of 0 V as a gate voltage is turned on and the PMOS transistor PM4 that is supplied with the first reference voltage VREFP as a gate voltage is turned off.

Before the point in time T1, the PMOS transistor PM5, which is supplied with a voltage set at the first node N1 as a gate voltage and a high voltage VDDH as a source voltage, is turned on. Also, the PMOS transistor PM1, which is supplied with a voltage set at the first node N1 as a gate voltage, is turned on, and the first protection transistor PM2, which is supplied with the first reference voltage VREFP as a gate voltage and a voltage of a third node N3 as a source voltage, is turned on.

Before the point in time T1, a voltage of the second node N2 is set to 0 V by the second restriction circuit 112b. The NMOS transistor NM3 of the second restriction circuit 112b is turned off by the input signal Vin having a voltage of 0 V, and the NMOS transistor NM4 thereof is turned on by the input signal Vin. Before a point in time T2, a voltage of the second node N2 is set to 0 V corresponding to the input signal Vin. The NMOS transistor NM1, which receives a voltage of the second node N2 as a gate voltage and a ground voltage as a source voltage, and the NMOS transistor NM5 are turned off. The fourth node N4 is set to the second reference voltage VREFN that is a gate voltage of the second protection transistor NM2. The fourth node N4 is set to the second reference voltage VREFN, which is a gate voltage of the second protection transistor NM2. While the output signal Vout is set to the high voltage VDDH, the fourth node N4 is set to a voltage level corresponding to a gate-source voltage of the second protection transistor NM2 because a gate voltage of the second protection transistor NM2 is fixed to the second reference voltage VREFN.

Accordingly, the output signal Vout is connected to the high voltage VDDH (i.e., 3.3 V) and is isolated from a ground. Thus, t the output signal Vout has the high voltage VDDH (i.e., 3.3 V) that is provided as a power supply voltage of the receiver 110b.

A voltage level of the input signal Vin that is provided through a pad increases from the point in time T1 to the point in time T2. At this time, the first restriction circuit 111a controls the first node N1 to maintain the first reference voltage VREFP, i.e., 1.5 V. The PMOS transistor PM4 maintains a turn-off state because a source voltage, which is a voltage level of the input signal Vin, is lower than a level of a gate voltage VREFP. The PMOS transistor PM3 maintains a turn-on state because a voltage of the input signal Vin that is provided as a gate voltage of the PMOS transistor PM3 is lower than the reference voltage VREFP, which is a source voltage of the PMOS transistor PM3. Thus, the first node N1 maintains the first reference voltage VREFP that is 1.5 V.

From the point in time T1 to the point in time T2, the input signal Vin received through the pad is transferred to the second node N2 by the second restriction circuit 112b. At this time, since a voltage level of the input signal Vin is lower than a level of the second reference voltage VREFN, the NMOS transistor NM3 maintains a turn-off state, and the NMOS transistor NM4 maintains a turn-on state. Thus, the input signal Vin is transmitted to the second node N2.

As a voltage of the second node N2 increases, the NMOS transistors NM1 and NM5 start to be turned on from a point in time T1'. However, the NMOS transistor NM1 may not be fully turned on before a voltage of the second node N2 becomes higher than a voltage of a sixth node N6 by a threshold voltage Vtn. At this time, the output voltage Vout of the output terminal starts to decrease and thereby a voltage of a seventh node N7 starts to decrease. In particular, during an interval from T1' to T2, the sixth node N6 is maintained at a voltage level that is obtained by dividing the second reference voltage VREFN by the transistors NM8 and NM5 and the compensation resistor R2. During the interval from T1' to T2, a voltage of the sixth node N6 maintains substantially a constant level.

From the point in time T2 to a point in time T3, a transition of the output voltage Vout occurs by the hysteresis setting parts 115b and 116b according to an exemplary embodiment. The input signal Vin reaches a level corresponding to half of the high voltage VDDH/2 at T2, and at a point in time T2', a voltage of the second node N2 becomes higher than a voltage of the sixth node N6 by a threshold voltage Vtn, i.e., higher than as a high reference voltage VIH. Thus, when the input signal Vin reaches the high reference value VIH higher than VDDH/2, the NMOS transistor NM1 is turned on, and the output signal Vout transitions to a ground level.

The input signal Vin reaches a high-voltage (VDDH) level at the point in time T3 and starts to fall from a point in time T4. However, even when a voltage level of the output signal Vout starts to fall, the output signal Vout maintains a low level during when a voltage level of the input signal Vin is higher than a level of a low reference voltage VIL.

At the point in time T4, a voltage level of the input signal Vin starts to fall from a high-voltage level. At this time, a voltage of the first node N1 starts to fall from the high voltage VDDH. However, the PMOS transistor PM1 maintains a turn-off state when a voltage of the first node N1 is not lower than (VDDH-Vtp). Thus, a voltage level of the output signal Vout is maintained at 0 V. However, as a voltage of the first node N1 decreases, the fifth node N5 is slowly charged. That is, a voltage of the fifth node N5 may increase. Even though the output signal Vout still maintains a low level at a point in time T4', a voltage level of the output signal Vout starts to increase.

Since a voltage level of the input signal Vin is not lower than (VDDH-Vtp) at a point in time T5, the output signal Vout increases but maintains a low level. However, at a point in time T5', voltages of the input signal Vin and the first node N1 fall to (VDDH-Vtp), which is the same as the low reference voltage VIL, and the PMOS transistor PM1 is turned on. At this time, the output signal Vout rises to a high level and reaches the high voltage VDDH. The low reference voltage VIL corresponding to a level of the input signal Vin at which the output signal Vout transitions to a high level is different from the high reference voltage VIH corresponding to a level of the input signal Vin at which the output signal Vout transitions to a low level. Thus, a hysteresis characteristic is provided.

At a point in time T6, the input signal Vin is set to 0 V. However, the output signal Vout has already been transitioned to a high level at the point in time T5' when the input signal Vin reaches the low reference voltage VIL. The receiver 110b according to an exemplary embodiment may provide a precise hysteresis characteristic about the input signal Vin, based on different reference voltages VIL and VIH.

Figure 7:
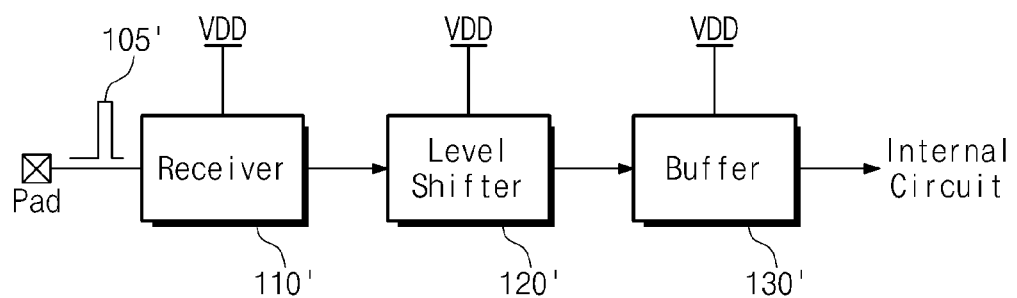
FIG. 7 is a block diagram schematically illustrating an input circuit according to another exemplary embodiment.

FIG. 7 is a block diagram schematically illustrating an input circuit 100b according to another exemplary embodiment. Referring to FIG. 7, an input circuit 100b according to another exemplary embodiment includes a receiver 110', a level shifter 120', and a buffer 130'. The input circuit 110b receives a signal with high reliability under a low-voltage (VDD) condition.

The receiver 110' receives an input signal 105' transferred through a pad as an electric signal to be processed in a chip. The receiver 110' receives the input signal 105' using a low voltage VDD as a power supply voltage. The receiver 110' may be implemented using a CMOS circuit or a Schmitt trigger circuit which drives the input signal 105 provided from the outside of a system on chip 20 through a pad with the low voltage VDD.

The level shifter 120' converts a level of an output signal of the receiver 110' into a level that is capable of being processed by the internal circuit 200 (refer to FIG. 1) or of being buffered by the buffer 130'. The level shifter 120' may not need to separately use a high-voltage (VDDH) level because an output signal of the receiver 110' has the low voltage VDD. The level shifter 120' converts a signal having a low-level level into a signal of a low-level domain and provides the converted signal to the buffer 130'.

The buffer 130' temporarily stores the input signal 105' of which level is converted by the level shifter 120'. The input signal 105' stored at the buffer 130' is provided to the internal circuit 200. The buffer 130' may be driven by the same level as that of a signal to be processed by the internal circuit 200. That is, the buffer 130' is supplied with the low voltage VDD and receives and outputs an output signal of the level shifter 120'.

The above-described input circuit 100b includes the receiver 110' and the level shifter 120' that use the low voltage VDD as a power supply voltage. Here, the receiver 110' and the level shifter 120' may use the same circuit as a receiver 110 and a level shifter 120 described with reference to FIG. 2. In this case, the receiver 110 and the level shifter 120 shown in FIG. 2 may be supplied with the low voltage VDD, instead of the high voltage VDDH. The input circuit 100b provides high reliability and improved noise characteristics with respect to the high voltage VDDH, the low voltage VDD, or various levels of power supply voltages.

Figure 8:
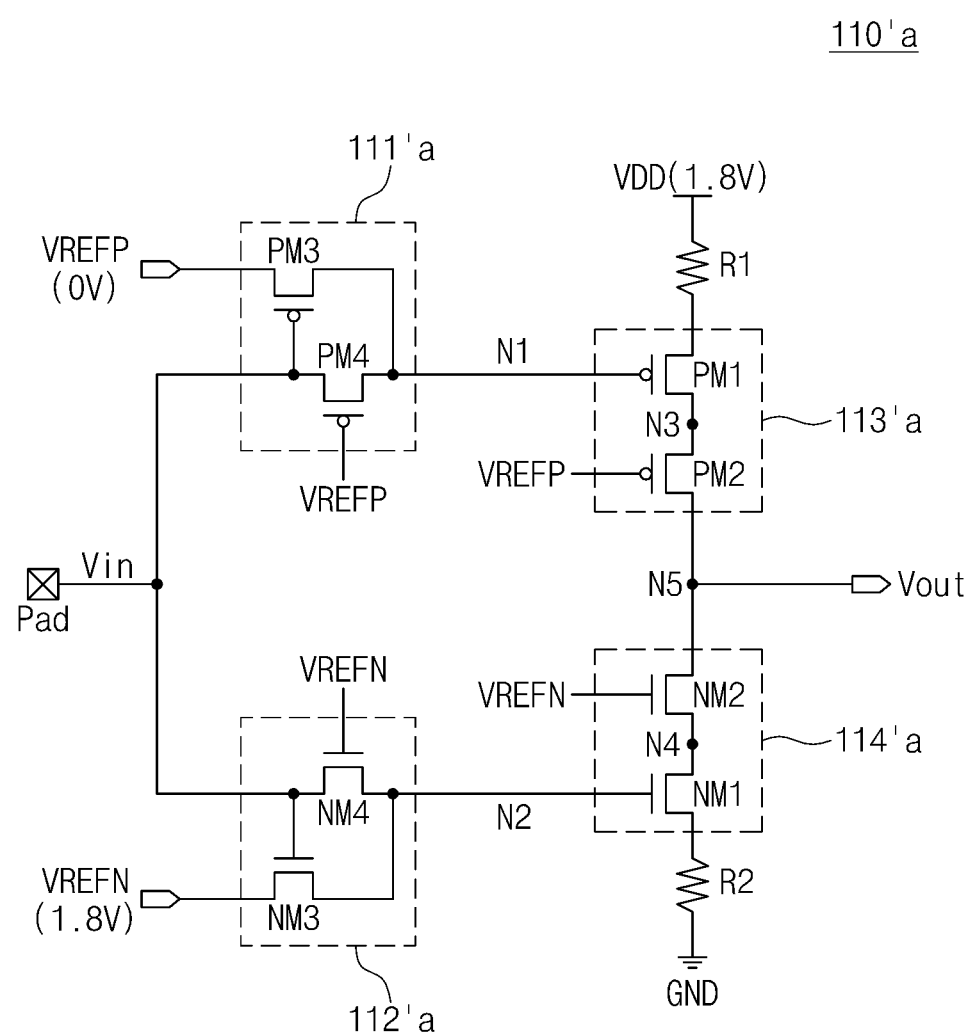
FIG. 8 is a circuit diagram showing a receiver shown in FIG. 7.

FIG. 8 is a circuit diagram showing a receiver 110' shown in FIG. 7. Referring to FIG. 8, the receiver 110'a contains restriction circuits 111'a and 112'a, transistors PM1 and NM1 constituting an inverter, protection transistors PM2 and NM2, and compensation resistors R1 and R2. It is assumed that a first reference voltage VREFP is 0 V and a second reference voltage VREFN is 1.8 V.

The restriction circuits 111'a and 112'a may include transistors that provide gate voltages of the transistors PM1 and NM1 constituting an inverter in response to an input signal Vin. When a voltage level of the input signal Vin is higher than a level of the first reference voltage VREFP, the first restriction circuit 111a transfers the input signal Vin to a first node N1, which is connected to a gate of the transistor PM1. That is, a voltage of the first node N1 is restricted to be greater than the first reference voltage VREFP, under a control of the first restriction circuit 111'a. Since a level of the input signal Vin is higher than 0 V, a level of the input signal Vin is provided to be the same as the first node N1.

The second restriction circuit 112'a transmits the input signal Vin to a second node N2, which is connected to a gate of the transistor NM1 in response to a voltage level of the input signal Vin being lower than a level of the second reference voltage VREFN. That is, a voltage of the second node N2 is restricted to be lower than the second reference voltage VREFN under a control of the second restriction circuit 112'a. However, when a maximum voltage level of the input signal Vin is 1.8 V, the voltage level of the input signal Vin may be transferred to the second node N2 without change. That is, the restriction circuits 111'a and 112'a may be implemented not to limit the input signal Vin when voltage levels of the input signal Vin and a power supply voltage correspond to the low voltage VDD.

The pull-up and pull-down parts 113'a and 114'a are implemented as transistors that respectively pull up and down an output signal Vout depending on a level of the input signal Vin. The protection transistors PM2 and NM2 maintain a turn-on state while the reference voltages VREFP and VREFN are applied thereto. Thus, voltages of the third and fourth nodes N3 and N4 and the output signal Vout may be the same.

The PMOS transistor PM1 is turned off when a voltage level of the input signal Vin transmitted to the first node N1 is higher than a level of a threshold voltage Vtp. On the other hand, the NMOS transistor NM1 is turned on when a voltage level of the input signal Vin transmitted to the second node N2 is higher than a level of a threshold voltage Vtn. That is, while a difference between the threshold voltages Vtn and Vtp may exist, the transistors PM1 and NM1 are complementarily turned on and off substantially the same time.

Figure 9:
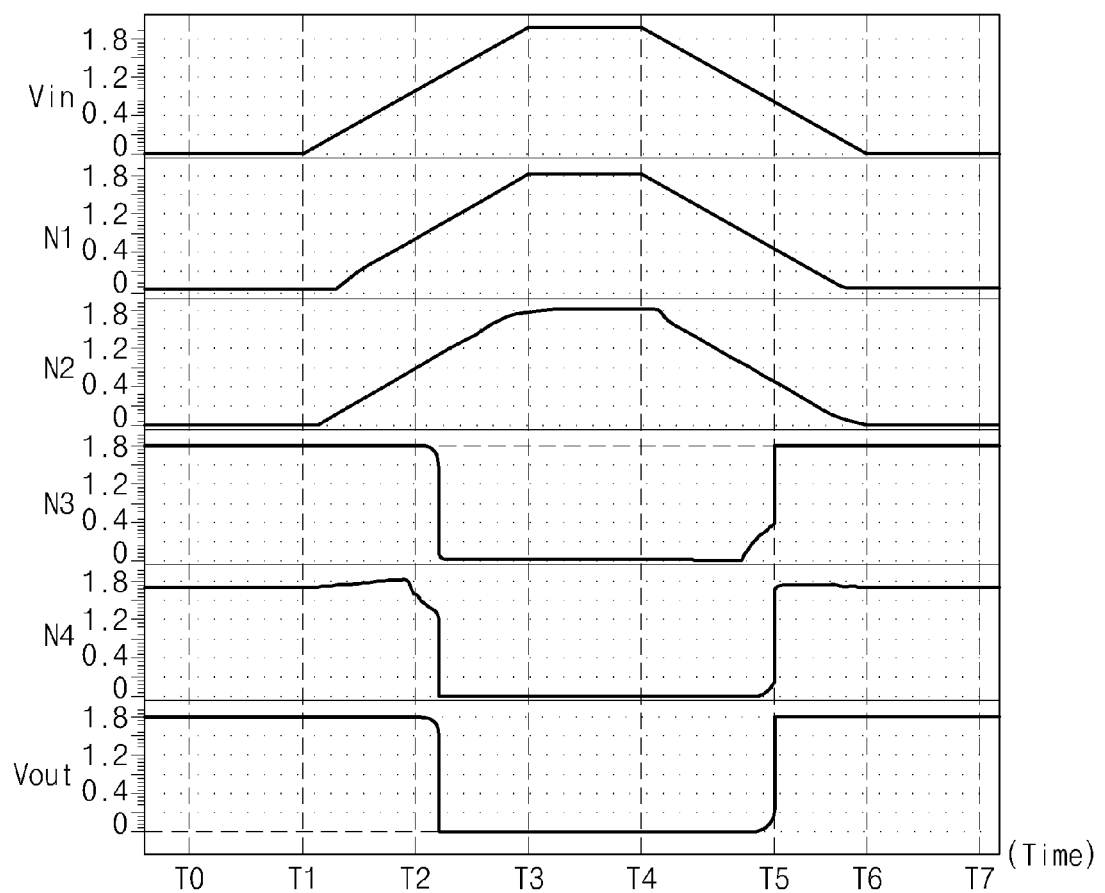
FIG. 9 is a waveform showing an operation of a receiver shown in FIG. 8.

FIG. 9 is a waveform showing an operation of the receiver 110'a shown in FIG. 8. Referring to FIG. 9, the receiver 110'a provides an output signal Vout having high reliability with respect to an input signal Vin having a low-voltage swing level. It is assumed that a level of the input signal Vin is 0 V before a point in time T1 when a level of the input signal Vin starts to vary. Also, it is assumed that a power supply voltage is 1.8 V, a first reference voltage VREFP is 0 V, and a second reference voltage VREFN is 1.8 V.

Before the point in time T1, the input signal Vin has 0 V. Thus, a first restriction circuit 111a sets the first node N1 to 1.5 V. That is, the PMOS transistors PM3 and PM4 of the first restriction circuit 1111a are turned on in response to the input signal Vin of 0 V. Thus, the PMOS transistor PM1, which receives a voltage of the first node N1 as a gate voltage and the low voltage VDD as a source voltage, is turned on, and the protection transistor PM2, which receives the first reference voltage VREFP (i.e., 0 V) as a gate voltage and a voltage of the third node N3 as a source voltage, is turned on. Before the point in time T1, a voltage of the second node N2 is 0 V corresponding to the input signal Vin. The NMOS transistor NM1, which receives a voltage of the second node N2 as a gate voltage and a ground voltage as a source voltage, is turned off, and the fourth node N4 is set to the second reference voltage VREFN, which is the gate voltage of the second protection transistor NM2. The output signal Vout at the output terminal is set to a level corresponding to the power supply voltage VDD.

A level of the input signal Vin that is provided through a pad increases from the point in time T1. At this time, voltages of the first and second nodes N1 and N2 also increase. Voltages of the third and fourth nodes N3 and N4 and the output signal Vout of the output terminal are maintained at 1.8 V.

At a point in time T2, a voltage level of the input signal Vin is transferred to the first and second nodes N1 and N2 while maintaining substantially the same level. When a voltage level of the input signal Vin transferred to the first and second nodes N1 and N2 is higher than a level of a threshold voltage Vtn of the NMOS transistor NM1 or a difference between the power supply voltage VDD and a threshold voltage Vtp of the PMOS transistor PM1, the PMOS transistor PM1 is turned off, and the NMOS transistor NM1 is turned on. At this time, the output terminal is pulled down and thereby voltage levels of the output signal Vout and the third and fourth nodes N3 and N4 drop to a ground level (or 0 V). A point in time when the output signal Vout transitions may be around a point in time when a level of the input signal Vin becomes a level about half the maximum level of the input signal Vin.

A point in time T3 is a point in time when the input signal Vin reaches the maximum level, i.e., 1.8 V. A voltage level of the output signal Vout is maintained at a ground level or 0 V until a point in time T5 when a level of the input signal Vin becomes lower than VDD/2. At this time, the PMOS transistor PM1 is turned on, and the NMOS transistor NM1 is turned off. Thus, levels of the output signals Vout and the third and fourth nodes N3 and N4 transition to the same level as a power supply voltage or VDD through a pull-up operation on the output terminal.

It is understood from the above description that a low-voltage input signal Vin is received with high reliability by providing a low voltage VDD as a power supply voltage to the receiver 110'a using a high voltage VDDH and adjusting reference voltages VREFP and VREFN. Thus, the input circuit provides a high-reliability interface with respect to various levels of power supply voltages.

Figure 10:
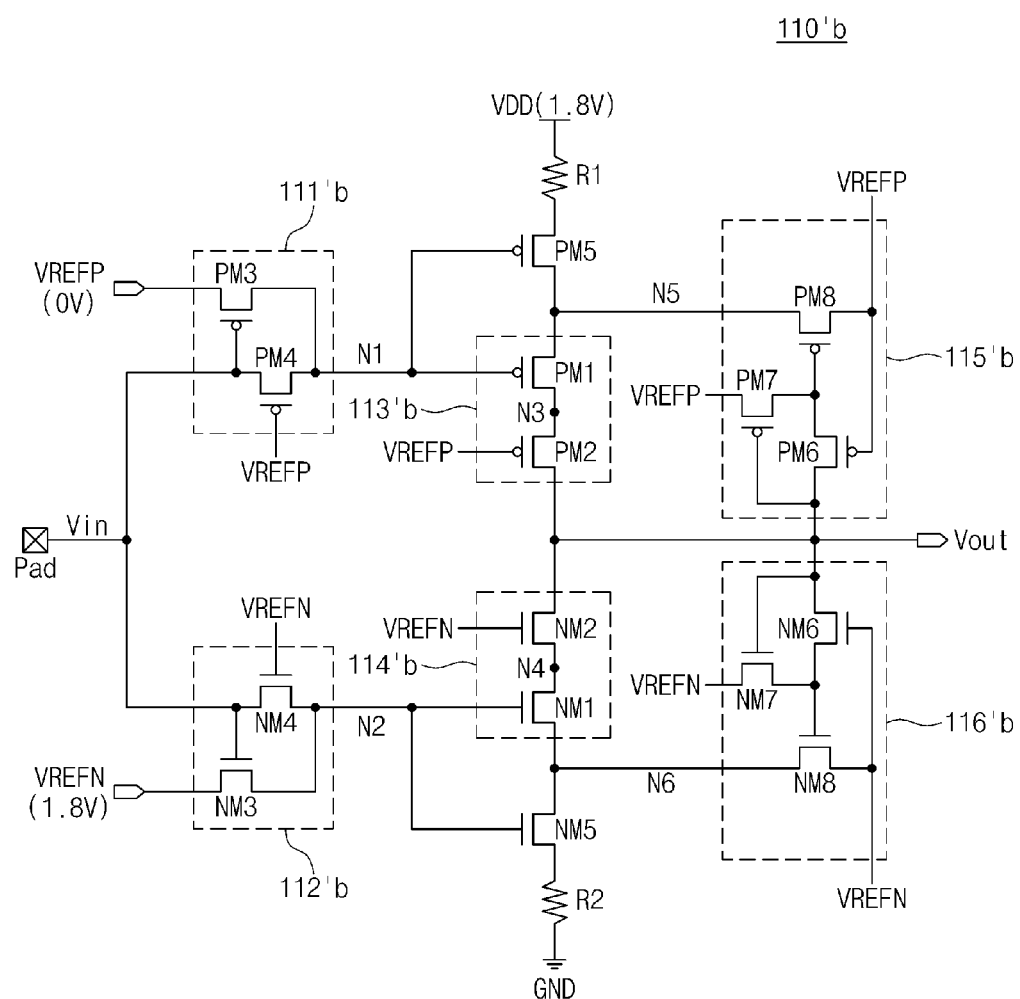
FIG. 10 is a circuit diagram showing a receiver 110 according to another exemplary embodiment.

FIG. 10 is a circuit diagram showing a receiver 110'b according to another exemplary embodiment. Referring to FIG. 10, the receiver 110'b is of a Schmitt trigger type that uses a low voltage VDD as a power supply voltage. The receiver 110'b provides an output signal Vout having a hysteresis characteristic with respect to an input signal Vin and includes restriction circuits 111'b and 112'b, a pull-up part 113'b, a pull-down part 114'b, hysteresis setting parts 115'b and 116'b, and compensation resistors R1 and R2. The receiver 110'b may correspond to an exemplary embodiment where a power supply voltage VDDH and reference voltages VREFP and VREFN applied to the receiver 110b shown in FIG. 4 are adjusted. By using the receivers 110b and 110'b, it is possible to implement a Schmitt trigger receiver with high voltage signal reception capacity at various situations where a high voltage VDDH and a low voltage VDD are used as power supply voltages.

The restriction circuits 111'b and 112'b provide gate voltages of transistors PM1 and NM1 constituting an inverter in response to an input signal Vin. However, when a first reference voltage VREFP and a second reference voltage VREFN are respectively set to 0 V and 1.8 V under a low voltage condition, the input signal Vin passes through the restriction circuits 111'b and 112'b and is transferred to first and second nodes N1 and N2.

The PMOS transistor PM1 transfers the power supply voltage VDD in response to a gate voltage of the first node N1. The PMOS transistor PM1 is turned off when a voltage of the first node N1 is higher than a source voltage of the PMOS transistor PM1 by a threshold voltage Vtp. The NMOS transistor NM1 pulls down a voltage of an output terminal N5 in response to a gate voltage of the second node N2. The NMOS transistor NM1 is turned on when a voltage of the second node N2 is higher than a threshold voltage Vtn.

The protection transistors PM2 and NM2 perform a protection operation against the power supply voltage VDD of the low voltage. Further, the protection transistors PM2 and NM2 may protect CMOS transistors PM1 and NM1 for performing an inverting function at an environment where the receiver 110'b is driven by the high voltage VDDH. The protection transistors PM2 and NM2 are maintained a turn-on state under a low-voltage condition in response to the reference voltages VREFP and VREFN being applied thereto.

The hysteresis setting parts 115'b and 116'b are implemented using a circuit that provides a hysteresis effect between an output signal Vout and the input signal Vin. That is, the hysteresis setting parts 115'b and 116'b may constitute a component for differently setting a level of the input signal Vin at which the output signal Vout transitions, with respect to rising and falling intervals of the input signal Vin. For example, the hysteresis setting parts 115'b and 116'b control the output signal Vout to transition when a voltage level of the input signal Vin is higher than a level of a first threshold voltage VIH in a rising interval of the input signal Vin. The hysteresis setting parts 115'b and 116'b control the output signal Vout to transition when a voltage level of the input signal Vin is smaller than a level of a second threshold voltage VIL in a falling interval of the input signal Vin.

Turn-on and turn-off levels of PMOS transistors PM5 and NM5 are determined depending on voltages of fifth and sixth nodes N5 and N6. That is, the transistor PM5 is turned off when a voltage of the first node N1 is lower than a voltage of the node N5 by a threshold voltage Vtp. On the other hand, the transistor NM5 is turned on when a voltage level of the second node N2 is higher than a voltage of the sixth node N6 by a threshold voltage Vtn. By using this characteristic, it is possible to provide the output signal Vout having a hysteresis characteristic with respect to the input signal Vin to determine voltages of the first and second nodes N1 and N2.

In a rising interval of the input signal Vin, a transition of the output voltage Vout is controlled by the hysteresis setting part 116'b that is supplied with the second reference voltage VREFN. When a level of the input signal Vin is 0 V, the fifth node N5 is set to the power supply voltage VDD (i.e., 1.8 V). Also, the sixth node N6 is set to the second reference voltage VREFN (i.e., 1.8 V).

When a voltage level of the input signal Vin increases, the NMOS transistor NM5 starts to be turned on and thereby a voltage of the sixth node N6 starts to decrease. The NMOS transistor NM1 is turned on when a voltage level of the input signal Vin is higher than a level of the voltage of the sixth node N6 by a threshold voltage Vtn. At this point in time, a voltage level of the output signal Vout sharply drops.

In a falling interval of the input signal Vin, a transition of the output voltage Vout is controlled by the hysteresis setting part 115'b that is supplied with the first reference voltage VREFP. The fifth node N5 is set to 0 V because the PMOS transistors PM5 and PM1 are turned off when the input signal Vin has the power supply voltage VDD (e.g., 1.8 V). At this time, the output signal Vout is grounded to a voltage of substantially 0 V. However, when a voltage level of the input signal Vin decreases to be smaller than (VDDH−Vtp), the PMOS transistor PM5 starts to be turned on and thereby levels of the fifth node N5 and the output signal Vout start to increase.

An operation of the hysteresis setting part 116'b in a falling interval of the input signal Vin is opposite to that in a rising interval of the input signal Vin. This will be described in detail with reference to a timing diagram later.

As above, a circuit structure of the receiver 110'b having a Schmitt trigger type is described. Similar to the receiver 110b (refer to FIG. 5) that accurately performs an operation of a Schmitt trigger circuit under a high-voltage condition, the receiver 110'b receives an input signal Vin with high accuracy under the low-voltage (VDD) condition. However, it may be needed to adjust the reference voltages VREFP and VREFN under the low-voltage condition.

Figure 11:
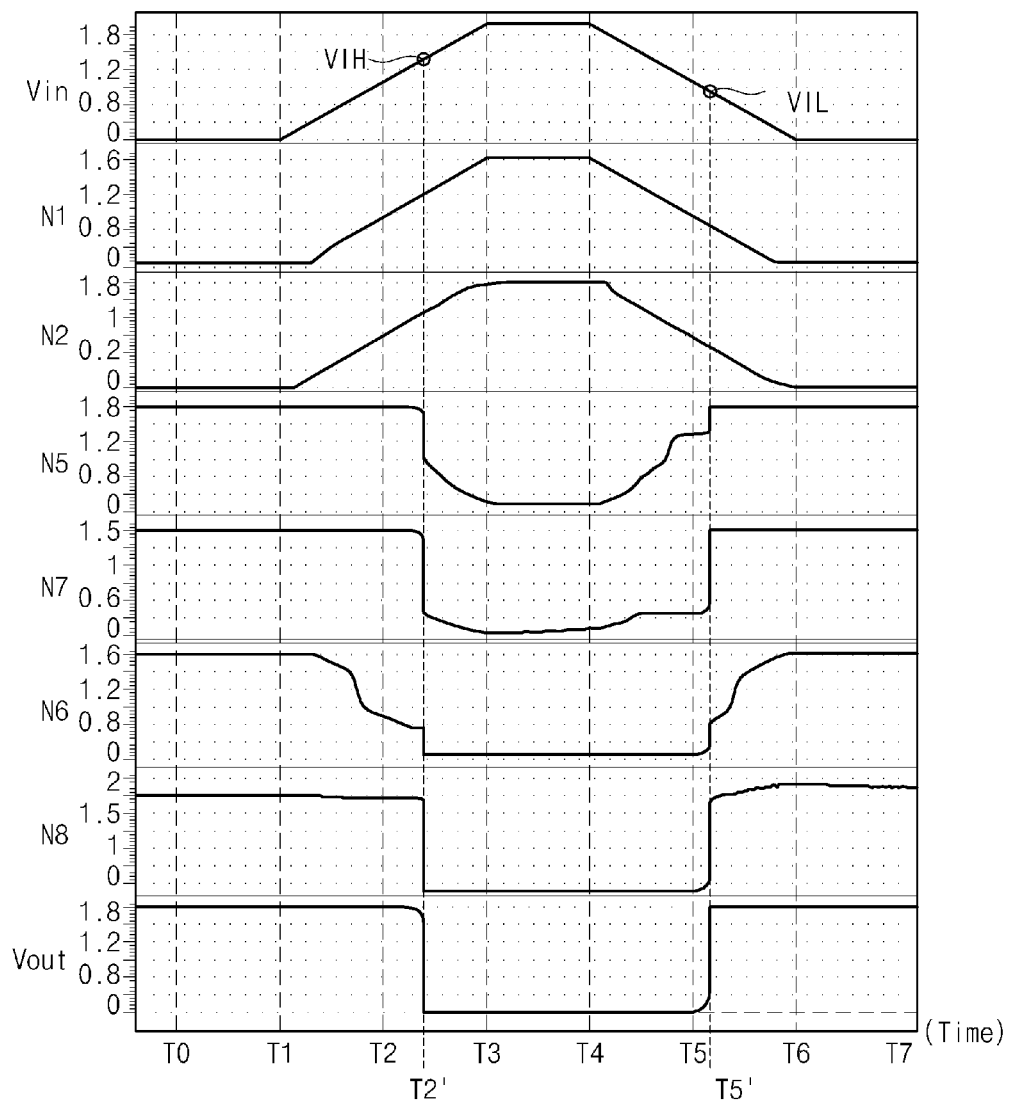
FIG. 11 is a waveform showing an operation of a receiver shown in FIG. 10.

FIG. 11 is a waveform showing an operation of the receiver 110'b shown in FIG. 10. Referring to FIG. 11, the receiver 110'b provides an output signal Vout having high reliability with respect to an input signal Vin having a low-voltage swing level. It is assumed that a power supply voltage is 1.8 V, a first reference voltage VREFP is 0 V, and a second reference voltage VREFN is 1.8 V. Thus, the first and second nodes N1 and N2 have the same voltage level as the input signal Vin as described above.

Before a point in time T1, the input signal Vin has 0 V. A PMOS transistor PM5, which receives a voltage of the first node N1 as a gate voltage and the low voltage VDD as a source voltage, is turned on. Also, a PMOS transistor PM1, which receives a voltage of the first node N1 as a gate voltage, is turned on. A first protection transistor PM2, which receives the first reference voltage VREFP (i.e., 0 V) as a gate voltage and a voltage of the third node N3 as a source voltage, is turned on. Also, NMOS transistors NM1 and NM5 are turned off in response to the input signal having 0 V. At this point in time, a voltage level of an output signal Vout on an output terminal is set to a high level, i.e., 1.8 V.

A voltage level of the input signal Vin that is provided through a pad increases from the point in time T1. As voltages of the first and second nodes N1 and N2 increase, the NMOS transistors NM1 and NM5 start to be turned on. Thus, a voltage of the sixth node N6 gradually drops. The NMOS transistor NM1 may not be fully turned on before a voltage of the second node N2 is higher than a voltage of the sixth node N6 by a threshold voltage Vtn. Thus, a voltage level of the output signal Vout on the output terminal is maintained at a low-voltage state.

After a point in time T2, a voltage level of the input signal Vin is higher than that of a voltage of the sixth node N6 by a threshold voltage Vtn. A voltage of the sixth node N6 may correspond to a voltage that is obtained by dividing the reference voltage VREFN by NMOS transistors NM8 and NM5 and a compensation resistor R2. Thus, as a voltage of the input signal Vin rises, a voltage of the sixth node N6 slowly decreases. When a voltage level of the input signal Vin is higher than that of a voltage of the sixth node N6 by a threshold voltage Vtn, the NMOS transistor NM1 is turned on, and the output terminal is pulled down. Thus, a voltage level of the output signal Vout drops to a ground voltage level. The output signal Vout transitions at a point in time when the input signal Vin reaches a reference voltage VIH higher than VDD/2 by the hysteresis setting part 116'b for setting a voltage of the sixth node N6.

A voltage level of the input signal Vin reaches a level of the low voltage VDD at a point in time T3 and starts to drop from a point in time T4. As a voltage level of the input signal Vin decreases at the point in time T4, charge starts to be transferred from the PMOS transistor PM5 to the fifth node N5. Thus, a voltage of the fifth node N5 gradually increases. However, the PMOS transistor PM1 is maintained at a turn-off state when a voltage level of the input signal Vin is not lower than (VDD−Vtp). Thus, a voltage level of the output signal Vout is maintained at 0 V.

A voltage level of the input signal Vin drops to VDD/2 at a point in time T5. However, since a voltage level of the input signal Vin is not lower than (VDD−Vtp) at the point in time T5, the output signal Vout is maintained at a low level. However, when a voltage level of the input signal Vin drops to (VDD−Vtp), the PMOS transistor PM1 is turned on. At this time, the output signal Vout rises to a high level at a point in time T5'. A reference voltage VIL, a level of the input signal Vin for the output signal Vout to transition to a high level and a reference voltage VIH for the output signal Vout to transition to a low level are set to different values. Thus, a hysteresis characteristic is provided.

At a point in time T6, the input signal Vin reaches 0 V. However, the output signal Vout has already been transitioned to a high level from a point in time when the input signal Vin drops to the reference voltage VIL.

As above, an operation of the receiver 110'b where reference voltages VIL and VIH for transitioning the output signal Vout in response to the input signal Vin are different for the rising and falling intervals of the input signal Vin is described. In the exemplary embodiments, it is possible to receive the input signal Vin under a low-voltage condition by changing the reference voltages VREFP and VREFN.

Figure 12:
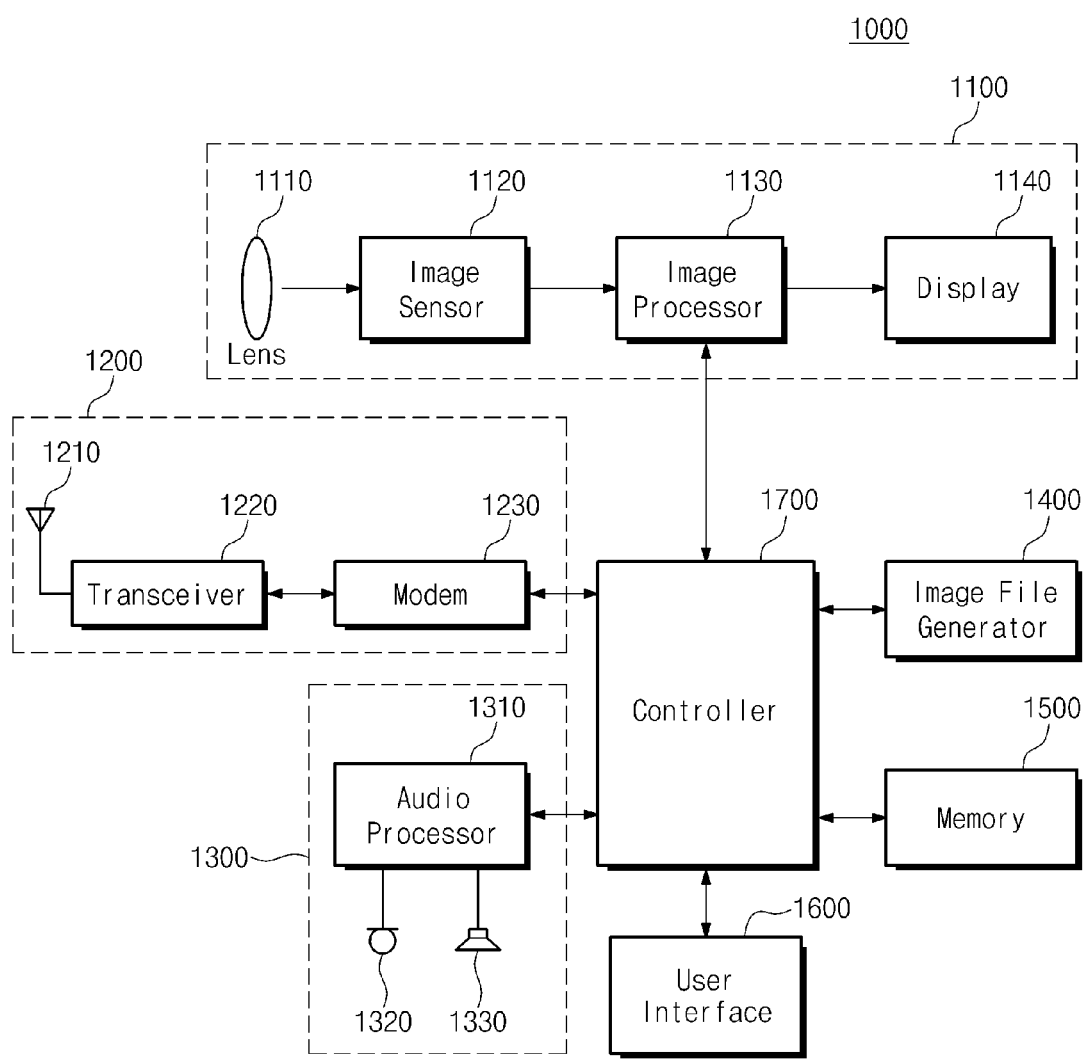
FIG. 12 is a block diagram schematically illustrating a portable terminal according to an exemplary embodiment.

FIG. 12 is a block diagram schematically illustrating a portable terminal according to an exemplary embodiment. Referring to FIG. 12, a portable terminal 1000 according to an exemplary embodiment contains an image processor part 1100, a radio frequency (RF) transceiver part 1200, an audio processor part 1300, an image file generator 1400, a memory 1500, a user interface 1600, and a controller 1700.

The image processor part 1100 includes a lens 1110, an image sensor 1120, an image processor 1130, and a display 1140. The RF transceiver part 1200 includes an antenna 1210, a transceiver 1220, and a modem 1230. The audio processor part 1300 includes an audio processor 1310, a microphone 1320, and a speaker 1330.

The memory 1500 may be implemented in the form of a memory card (e.g., multimedia card (MMC), embedded MMC (eMMC), secure digital (SD), or microSD). The controller 1700 may be implemented in the form of a system on chip that drives an application program, an operating system, and so on.

An input circuit of the modem 1230, the controller 1700, which is implemented in the form of system on chip, or the memory 1500 may include a receiver according to exemplary embodiments. Thus, it is possible to receive data with high reliability while a high voltage VDDH is used as a power supply voltage.

A semiconductor device according to an exemplary embodiment may be packaged according to any of a variety of different packaging technologies. Examples of such packaging technologies may include, but is not limited thereto, package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), small outline (SOIC), shrink small outline package (SSOP), thin small outline (TSOP), thin quad flatpack (TQFP), system in package (SIP), multi chip package (MCP), wafer-level fabricated package (WFP), and wafer-level processed stack package (WSP).

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A receiver circuit which receives an input signal through a pad, the receiver circuit comprising:
   a first restriction circuit configured to provide a first reference voltage or an input signal to a first node, the input signal having a voltage higher than the first reference voltage;
   a second restriction circuit configured to provide a second reference voltage or the input signal to a second node, the input signal having a voltage lower than the second reference voltage;
   a first PMOS transistor configured to pull up an output node based on a voltage of the first node;
   a first NMOS transistor configured to pull down the output node based on a voltage of the second node;
   a second PMOS transistor connected between the output node and the first PMOS transistor;
   a second NMOS transistor connected between the output node and the first NMOS transistor; and
   at least one compensation resistor connected between a power supply voltage and one end of the first PMOS transistor or between one end of the first NMOS transistor and a ground,
   wherein the first restriction circuit comprises a third PMOS transistor configured to provide the first reference voltage to the first node in response to the input signal.

2. The receiver circuit of claim 1, wherein the first restriction circuit further comprises:
   a fourth PMOS transistor configured to provide the input signal to the first node in response to the first reference voltage.

3. The receiver circuit of claim 1, wherein the second restriction circuit comprises:
a third NMOS transistor configured to provide the second reference voltage to the second node in response to the input signal; and
a fourth NMOS transistor configured to provide the input signal to the second node in response to the second reference voltage.

4. The receiver circuit of claim 1, wherein the first reference voltage is provided to a gate of the second PMOS transistor and the second reference voltage is provided to a gate of the second PMOS NMOS transistor.

5. The receiver circuit of claim 1, wherein the power supply voltage is higher than at least one of the first reference voltage and the second reference voltage.

6. The receiver circuit of claim 5, wherein the first reference voltage corresponds to a difference between the power supply voltage and the second reference voltage.

7. The receiver circuit of claim 1, wherein the power supply voltage corresponds to the second reference voltage and the first reference voltage corresponds to a ground voltage.

8. The receiver circuit of claim 7, wherein, when the input signal is provided by the first or second restriction circuit, the input signal is provided without modification to a level thereof.

9. The receiver circuit of claim 1, further comprising:
a fourth PMOS transistor having a gate connected to the first node, and being connected between the first PMOS transistor and the power supply voltage; and
a third NMOS transistor having a gate connected to the second node, and being connected between the first NMOS transistor and the ground.

10. The receiver circuit of claim 9, further comprising:
a first hysteresis setting part configured to provide a first bias voltage to a source of the first PMOS transistor based on the first reference voltage and an output signal that is output to the output node.

11. The receiver circuit of claim 10, wherein the first hysteresis setting part comprises:
a fifth PMOS transistor configured to connect between the first reference voltage and the source of the first PMOS transistor;
a sixth PMOS transistor configured to provide the first reference voltage to a gate of the fifth PMOS transistor in response to the output signal; and
a seventh PMOS transistor configured to provide the output signal to the gate of the fifth PMOS transistor in response to the first reference signal.

12. The receiver circuit of claim 9, further comprising:
a second hysteresis setting part configured to provide a second bias voltage to a source of the first NMOS transistor based on the second reference voltage and an output signal that is output to the output node.

13. The receiver circuit of claim 12, wherein the second hysteresis setting part comprises:
a fourth NMOS transistor configured to connect between the second reference voltage and the source of the first NMOS transistor;
a fifth NMOS transistor configured to provide the second reference voltage to a gate of the fourth NMOS transistor in response to the output signal; and
a sixth NMOS transistor configured to provide the output signal to the gate of the fourth NMOS transistor in response to the second reference signal.

14. A receiver circuit which receives an input signal through a mad, comprising:
a first restriction circuit configured to provide the input signal higher than a first reference voltage to a first node;
a second restriction circuit configured to provide the input signal lower than a second reference voltage to a second node;
a first PMOS transistor configured to pull up an output node based on a voltage of the first node;
a first NMOS transistor configured to pull down the output node based on a voltage of the second node;
a second PMOS transistor having a gate connected to the first node, and being connected between a power supply voltage and a source of the first PMOS transistor;
a first hysteresis setting part configured to control a voltage of the source of the first PMOS transistor based on the output signal;
a second NMOS transistor having a gate connected to the second node, and being connected between a source of the first NMOS transistor and a ground; and
a second hysteresis setting part configured to control a voltage of the source of the first NMOS transistor based on the output signal.

15. The receiver circuit of claim 14, wherein the first restriction circuit is configured to provide the first reference voltage to the first node in response to a level of the input signal being lower than the first reference voltage.

16. The receiver circuit of claim 14, wherein the second restriction circuit is configured to provide the second reference voltage to the second node in response to a level of the input signal being higher than the second reference voltage.

17. The receiver circuit of claim 14, further comprising:
a first compensation resistor connected between the power supply voltage and the source of the first PMOS transistor; and
a second compensation resistor connected between the ground and the source of the first NMOS transistor.

18. The receiver circuit of claim 14, further comprising:
a third PMOS transistor connected between the output node and the first PMOS transistor; and
a third NMOS transistor connected between the output node and the first NMOS transistor.

19. The receiver circuit of claim 18, wherein the first reference voltage is provided to a gate of the third PMOS transistor and the second reference voltage is provided to a gate of the third NMOS transistor.

20. A receiver circuit, comprising:
a first restriction circuit configured to provide an input signal higher than a first reference voltage to a first node;
a second restriction circuit configured to provide the input signal lower than a second reference voltage to a second node;
a first PMOS transistor configured to pull up an output node based on a voltage of the first node;
a first NMOS transistor configured to pull down the output node based on a voltage of the second node;
a second PMOS transistor having a gate connected to the first node, and being connected between a power supply voltage and a source of the first PMOS transistor;
a first hysteresis setting part configured to control a voltage of the source of the first PMOS transistor based on the output signal;
a second NMOS transistor having a gate connected to the second node, and being connected between a source of the first NMOS transistor and a ground; and a second hysteresis setting part configured to control a voltage of the source of the first NMOS transistor based on the output signal, wherein the first hysteresis setting part comprises:
- a fourth PMOS transistor configured to connect between the first reference voltage and the source of the first PMOS transistor;
- a fifth PMOS transistor configured to provide the first reference voltage to a gate of the fourth PMOS transistor in response to the output signal; and
- a sixth PMOS transistor configured to provide the output signal to the gate of the fourth PMOS transistor in response to the first reference signal.

* * * * *